United States Patent

Konstantinov

[11] Patent Number: 6,100,111
[45] Date of Patent: Aug. 8, 2000

[54] METHOD FOR FABRICATING A SILICON CARBIDE DEVICE

[75] Inventor: Andrei Konstantinov, Järfälla, Sweden

[73] Assignee: ABB Research Ltd., Vasteras, Sweden

[21] Appl. No.: 09/055,281

[22] Filed: Apr. 6, 1998

[30] Foreign Application Priority Data

Mar. 23, 1998 [SE] Sweden ................................. 9800960

[51] Int. Cl.$^7$ ................................................ H01L 21/20
[52] U.S. Cl. .......................... 438/92; 438/93; 438/483; 438/518
[58] Field of Search ................. 438/92, 483, 514, 438/518, 527, 520, 521, 570, 572, 689, 156, 192, 197, 931, 494, 495; 257/77, 655, 657

[56] References Cited

U.S. PATENT DOCUMENTS

| | | | |
|---|---|---|---|
| 5,914,499 | 6/1999 | Hermansson et al. | 438/43 |
| 5,915,194 | 6/1999 | Powell et al. | 438/478 |
| 5,932,894 | 8/1999 | Bakowski et al. | 257/76 |
| 5,967,795 | 10/1999 | Bakowski et al. | 438/494 |
| 5,972,801 | 10/1999 | Lipkiw et al. | 438/772 |

FOREIGN PATENT DOCUMENTS 9-27489   of 1997   Japan .

OTHER PUBLICATIONS

Kato et al., Defects of 6H–SiC substrates made by Achesons method and by modified Lely's method, Inst. Phys. Conf. Sec. No. 142, Chapter 2, 1996, pp. 417–420.

B. Jayant Baliga, "Modern Power Devices", Chapter 3, John Wiley & Sons, Inc., New York, 1987.

Neudeck et al., Performance Limiting Micropipe Defects in Silicon Carbide Wafers, IEEE Electron Device Letters, vol. 15, No. 2, 1994, pp. 63–65.

Tsvetkov et al., Recent progress in SiC crystal growth, Inst. Phys. Conf. Ser. No. 142; Chapter 1, 1996, pp. 17–22.

*Primary Examiner*—Savitri Mulpuri
*Attorney, Agent, or Firm*—Pollock, Vande, Sande & Amernick

[57] ABSTRACT

A method of fabricating a semiconductor device on a substrate, wherein the substrate comprises a first layer of doped silicon carbide of a first conducting type and exhibits at least one hollow defect. In a first step the positions of the hollow defects in the substrate are identified, whereafter a second SiC layer of a second conducting type is formed in contact with the first layer, whereafter the first and second layer constituting the pn junction are provided with at least one edge termination surrounding any hollow defect, whereby the defect is excluded from the high-field region of the device.

13 Claims, 4 Drawing Sheets

METHOD FOR FABRICATING A SILICON CARBIDE DEVICE

TECHNICAL FIELD

A method for fabricating a semiconductor device on a silicon carbide substrate exhibiting hollow defects and a device fabricated by the method.

BACKGROUND OF THE INVENTION

Semiconductor devices having silicon carbide as base material are continuously developed to be used in connection with high temperatures, high power applications and under high radiation conditions. Under such circumstances conventional semiconductors do not work satisfactorily. Evaluations indicate that SiC semiconductors of power MISFET-type and diode rectifiers based on SiC would be able to operate over a greater voltage and temperature interval, e.g. up to 650–800° C., and show better switching properties such as lower losses and higher working frequencies and nevertheless have a volume 20 times smaller than corresponding silicon devices. These possible improvements are based on the favorable material properties that silicon carbide possesses in relation to silicon, such, e.g., a higher breakdown field (up to 10 times higher than silicon), a higher thermal conductivity (more than 3 times higher than silicon) and a higher energy band gap (2.86 eV for 6H-SiC, one of the crystal structures of SiC).

SiC semiconductor technology is relatively new and in many aspects immature. There are many critical manufacturing problems that are to be solved before SiC semiconductor devices may be realized experimentally and large scale manufacturing may become a reality. This is especially true of devices intended for use in high-power and high-voltage applications. SiC device manufacturing usually has an SiC substrate as starting material. For SiC devices to be commercially interesting for large scale production the substrates have to be produced at a low cost. Substrates are usually cut from a single crystal boule. There are a few alternative methods to grow a single crystal boule as described by V. F. Tsvetkov et al. in "Recent progress in SiC crystal growth", Inst. Phys. Conf. Ser. No 142: Chapter 1, but the only technique for large scale production of SiC substrates that has shown promise to date is seeded sublimation growth. However, one drawback of this technique is that the boules, and thus also the substrates contain hollow penetrating defects, which are usually referred to as micropipes. These defects are caused by a number of mechanisms and are in fact small diameter holes, which may extend all the way through the boule in the growth direction. Typically, the diameter of the holes is 0.1–5 μm. The micropipes are inherent to further layers grown epitaxially on a substrate containing micropipes. The micropipes are therefore harmful for high voltage devices, as was initially described by P. G. Neudeck et al., "Performance limiting micropipe defects in silicon carbide wafers", IEEE Electron Device Lett. 15, 63 (1994). Apart from the hollow, seeded sublimation grown SiC boules also exhibit a number of other types of defects, such as dislocations and stacking faults.

High power devices are normally designed as vertical devices with the current transport mainly perpendicular to the substrate surface in order to get a large area through which the on-state current passes. A given design current gives a minimum area for the current transport. The micropipes cannot be present within the device as they will greatly reduce the maximum reverse voltage over the device. Thus, a large area free from micropipes is required to make the substrate suitable for a device capable of handling high currents. State of the art substrates have a micropipe density of between 1 and 200 per $cm^2$, limiting the maximum area available for a device. Components that require a higher current than is feasible with a single SiC device have to rely on a number of devices arranged parallel to each other. However, as the single devices are not identical with each other care has to be taken when designing the component to avoid breakdown of a single device within the component during operation. Furthermore, increasing the number of devices within a component makes packaging a challenge.

There are a few other types of crystal defects apart from micropipes, e.g. dislocations and stacking faults. However, these types of defects have not shown to significantly effect the function of a high voltage device. Micropipes can in principle be found on SiC substrates by inspection in a phase-contrast optical microscope "T. Kato, M. Ohato, M. Razeghi and T. Okudo, IOP Conf. Proc. 142, pp. 417–420 (1996)". Other techniques that are used for detecting the micropipes include x-ray topography.

In the Japanese patent application 7-175045 a method is disclosed of how to reduce the leakage current in a pn junction. The method is based on heat-oxidizing the inner wall of the micropipe. However, the method does not eliminate the problem for high power devices designed to block voltages close to the theoretical limit of SiC. Furthermore, if a hole is still present after the oxidation of the inner walls of the micropipe, this will decrease the maximum reverse voltage the device can block.

SUMMARY OF THE INVENTION

The invention aims at solving the problem with micropipes by excluding them from the high-field region of the device. Thus, it becomes possible to use a larger fraction of the surface of substrates exhibiting hollow defects, commonly known as micropipes.

State of the art SiC substrates which have been grown by seeded sublimation growth exhibit micropipes. Epitaxial layers grown on a substrate exhibiting micropipes will inherit the micropipes. Presently, SiC devices are manufactured with the size of the devices not significantly exceeding the distance between the micropipes. Thus, a reasonable yield of micropipe free devices is ensured. According to the present invention the configuration of the power device is modified so that the micropipes are excluded from the high field region of the device. Thus, the size of the device can be chosen considerably larger than the mean distance between the micropipes. Furthermore, a high yield of devices with near-theoretical breakdown voltage is obtained. The electric field outside the high-field region is substantially lower than within the high-field region. For a high voltage high power device the high-field region comprises an active region and a termination region. The active region must ensure a low resistance under the on-state conditions and therefore it includes metal contacts and/or low resistivity barrier layers. The high-field device region is, however, somewhat larger than the active region because of the lateral extension of the electric field under the off state of the device. The purpose of the termination region is to limit the extension of the high-field region.

The micropipes can be detected in an ordinary far-field optical microscope by using polarized light in transmission and using a polarizing filter in the perpendicular direction in the detection optics. There are also a number of other methods that can be used as, for example, x-ray topography.

To exclude the regions adjacent to the micropipes from the high field regions the device is processed in such a way that low-resistivity layers or metal contacts are excluded from the top of the crystal close to the micropipes. A certain selected type of junction termination is applied to eliminate or suppress the electric field concentration at the edges of the low-resistivity regions at the top of the crystal.

A number of junction termination techniques are known for silicon devices such as forming zone plates and floating rings surrounding the device "Modern power devices, B. Jayant Baliga, Chapter 3, John Wiley & Sons Inc., New York 1987". Some of the techniques used for silicon devices have been used also for silicon carbide devices while some other techniques are specific for SiC devices. Preferably the same type of junction termination technique is applied to the regions around the micropipes as that used to terminate the periphery of the device, as this does not require any additional process steps.

Techniques of forming a JTE in a SiC device have been disclosed in the U.S. patent application Ser. No. 520,689. The technique for forming a planar junction termination extension has been described in U.S. patent application Ser. No. 683,059 (Bakowski et al.).

DETAILED DESCRIPTION OF PREFERRED EMBODIMENTS

The invention will be described in a number of embodiments with reference to the drawings. The drawings are not drawn to scale and some dimensions are thus strongly exaggerated in order to more clearly show the fundamental architecture of the devices.

According to the present invention an SiC substrate is the starting material for producing an SiC semiconductor device comprising a pn junction. The substrate exhibits hollow defects, which are more commonly known as micropipes.

Figure 1:
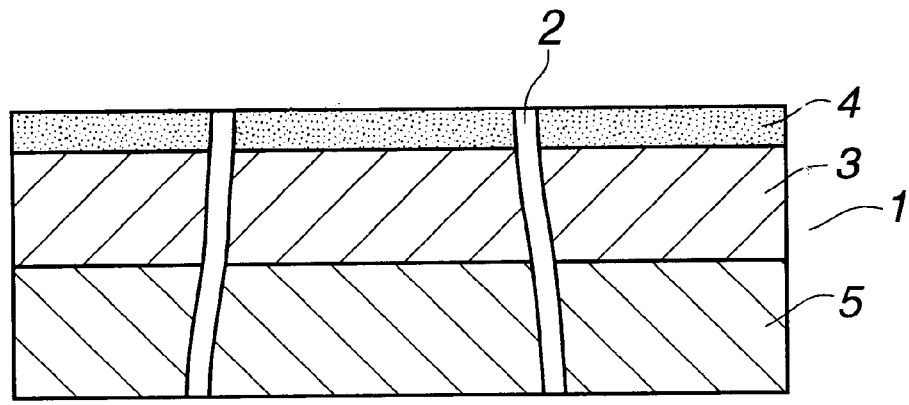
FIG. 1 shows a prior art device.

FIG. 1 illustrates a prior art SiC device 1 comprising a pn junction where the device exhibits micropipes 2. The device has a first lowly n-doped SiC layer 3. On top of the low doped n-type layer a second highly p-doped SiC layer 4 is epitaxially grown. The first layer has been epitaxially grown on top of a third n-doped SiC layer 5. The two doped n-type layers 5 and 3 constitute a substrate. The highly doped p-type layer and the low doped n-type layer form a pn-junction. The micropipes penetrate the pn-junction and limit the maximum reverse voltage over the pn-junction.

Figure 2:
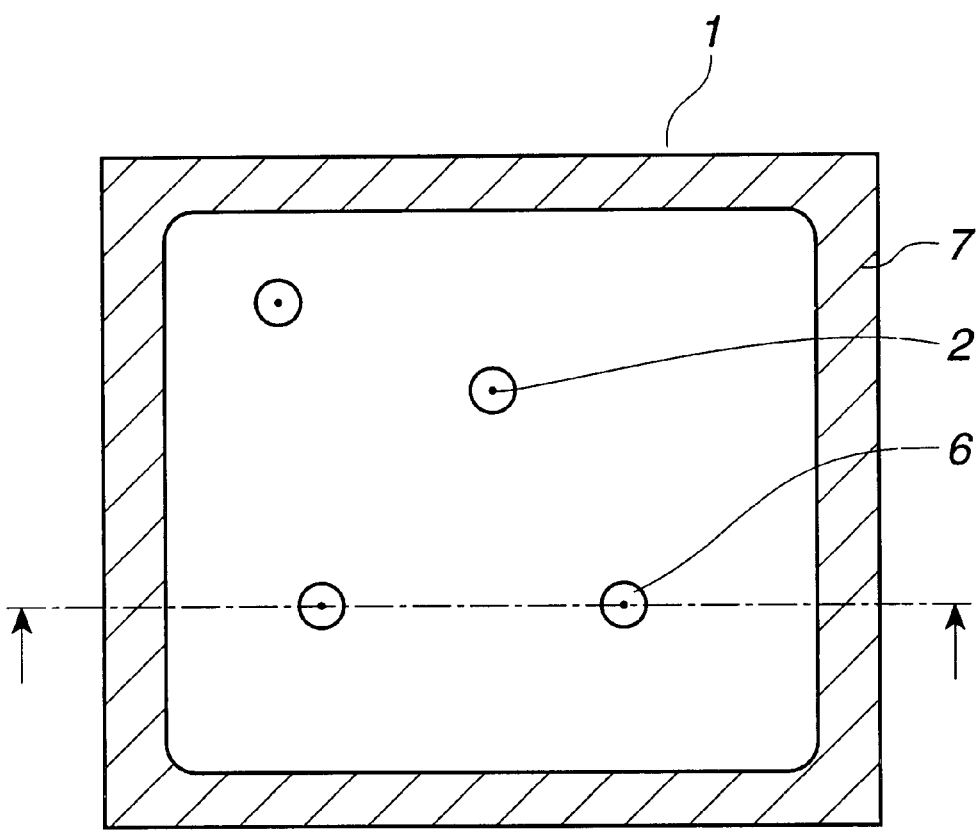
FIG. 2 shows a device according to the present invention, so that the micropipes are excluded from the high-field region of the device.
Figure 3:
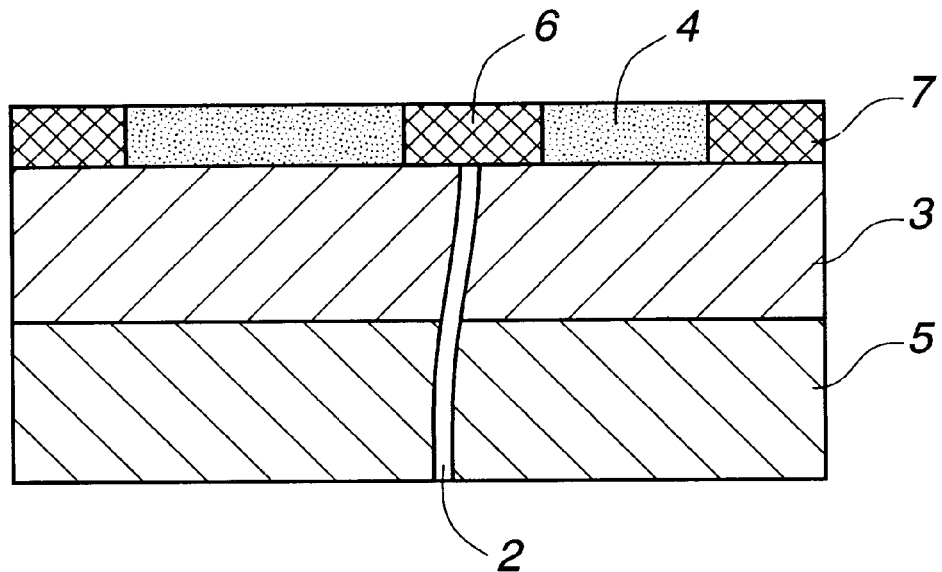
FIG. 3 shows a schematic cross section of the device in FIG. 2.

FIG. 2 and 3 illustrate an SiC diode according to the present invention. A device 1 has been manufactured starting with a substrate exhibiting micropipes 2 which are displayed in the figure. The micropipes extend in a direction mainly in the growth direction of the boule perpendicular to the surface of the substrate. The mapping of the positions of the micropipes on a substrate is started by making alignment marks on the substrate. The alignment marks are preferably placed at the periphery of the substrate. The substrate is inspected in a transmission optical microscope using polarized light for illumination and a polarizing filter in the perpendicular direction in the detection optics. By focusing on the bulk of the substrate only the irregularities of the crystal are visible using this technique. The positions of the micropipes relative to the alignment marks are stored either manually or automatically in a memory. There are a number of other techniques used to detect micropipes as for example x-ray topography.

According to an embodiment of the present invention a pn junction is formed on a substrate exhibiting micropipes. The micropipes are mapped and their positions are stored in a memory. In a further processing step regions 6 with low or zero electric field are formed around the micropipes. The termination regions are positioned through direct write optical lithography. The positions of the micropipes, that have been stored in the memory, are used when controlling the lithography. The termination regions exhibit a stepwise or continuously decreasing effective sheet charge density in a direction towards the micropipes, that substantially reduces the electric field at the micropipe. The sheet charge density is defined as the integral of the doping density over the thickness of the layer. The termination 7 at the edge of the component is also shown in the figures.

Figure 4:
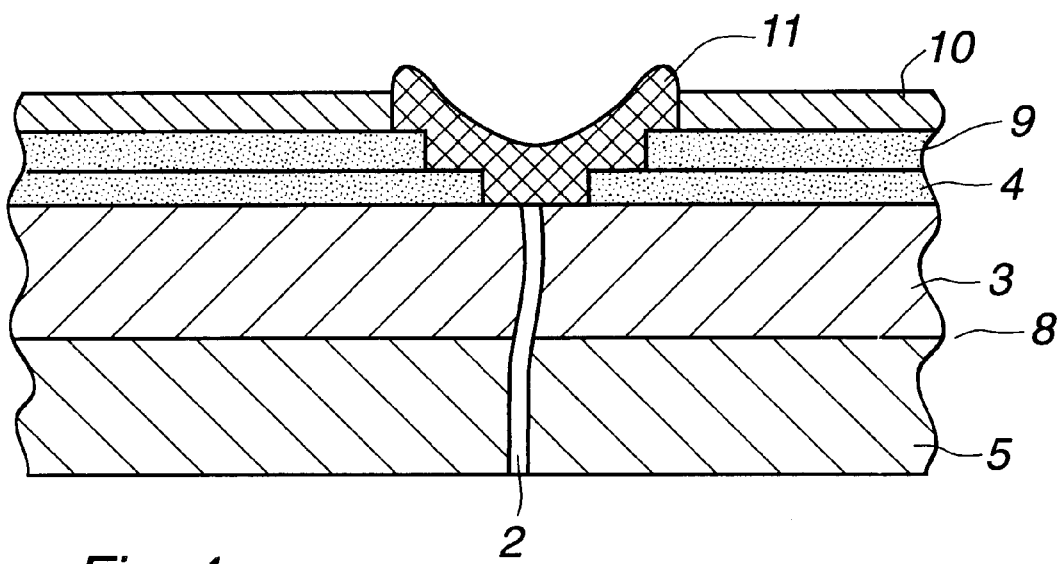
FIG. 4 shows a detailed cross section of a region around a micropipe, where the micropipe is excluded from the high-field region of the device by means of a termination region according to an embodiment of the present invention.

FIG. 4 shows a pn diode 8 according to a first embodiment of the present invention. A device as shown in FIG. 4 is manufactured by starting with an SiC substrate exhibiting a micropipe 2, having a first layer of low n-doped SiC 3. A second p-doped layer 4 is epitaxially grown on top of the low doped layer. The p-doped layer has a higher doping concentration than the low doped n-type layer. The first layer have been epitaxially grown on top of a third n-doped layer 5. In a masking step, areas surrounding the micropipes are left unmasked using direct write lithography. The positions stored in the memory are used to control the lithography. The parts of the second p-doped layer 4 which are not covered by the mask are etched away, leaving a layer that has a higher doping concentration and a smaller areal extension than the first layer 3. Specifically, areas surrounding the micropipes, covered by the lowly doped n-type layer, are not covered by the third layer. On top of the p-doped layer a fourth higher doped p-type layer 9 is epitaxially grown. Through masking and etching the area of the fourth layer is reduced. The areas surrounding the micropipes not covered by the fourth layer are even larger compared with the second layer. Thus, a termination region is achieved having a stepwise decreasing effective sheet charge density in a direction towards the micropipe. A metal contact 10 is applied on the fourth layer. A passivating layer 11 is applied over the micropipe as well as the termination region. Techniques of forming a JTE according to this embodiment of the present invention have been described in the U.S. patent application Ser. No. 520,689.

Figure 5:
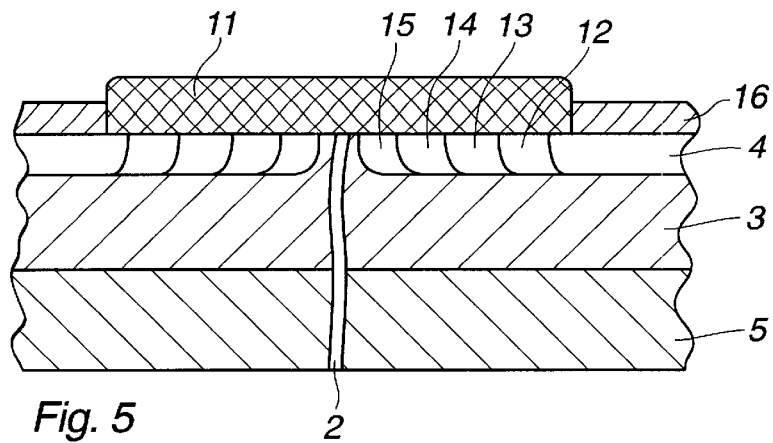
FIG. 5 shows a cross section of a region around a micropipe, where the micropipe is excluded from the high-field region of the device by means of a termination region according to an alternative embodiment of the present invention.

A pn diode according to a second preferred embodiment of the present invention, is shown in FIG. 5. A device as shown in FIG. 5 is manufactured by starting with a substrate exhibiting a micropipe, having a first layer of low n-doped SiC 3. By masking the areas surrounding the micropipes as well as masking the area outside the extension of the prospective third layer, followed by ion implantation of the unmasked parts, a second p-doped layer 4 is formed. The first layer has been epitaxially grown on top of a third n-doped layer 5. The forming of the ion implantation mask includes a direct write lithography step in which the positions stored in the memory are used to control the lithography. A first zone 12 of the termination region surrounding the micropipes is formed by unmasking areas adjacent to the third layer surrounding the micropipes followed by ion implantation. While unmasking the zones surrounding the micropipes, the same steps may be taken in forming the termination region at the outer border of the device. The doping concentration in the third layer will be the sum of the doping doses in the two implantation stages. Further zones 13, 14, 15 are formed by successive demasking of the zones followed by ion implantation. Thus, a termination region is achieved having a stepwise decreasing effective sheet charge density in a direction towards the micropipe. The ions used for the implantation are Aluminum, Boron or Gallium to form p-conducting material while Nitrogen is used to form n-conducting material. A passivating layer 11 is applied over the micropipe as well as the termination region. The technique of how to form a planar junction termination extension has been described in U.S. patent application Ser. No. 683,059 (Bakowski et al.). A metal contact 16 is formed in contact with the second layer.

According to a fourth embodiment of the present invention the pn junction is produced in accordance with any one of the preceding embodiments. The JTEs, excluding the micropipes from the high-field region of the device, are formed in a single ion implantation step. An ion implantation mask is created on top of the second layer, adjacent to the third layer, through direct write optical lithography utilizing the positions of the micropipes, stored in the memory, to control the lithography. The areas of the mask surrounding the micropipes exhibit holes. The size of the holes are decreasing in a direction towards the micropipes. Alternatively the distance between the holes is increasing in a direction towards the micropipes. Through ion implantation implanted zones constituting the JTE are formed, where the JTE:s exhibit a decreasing total doping concentration in a direction towards the micropipes. The distance between the implanted zones as well as the size of them is on the order of a few micrometers.

Figure 6:
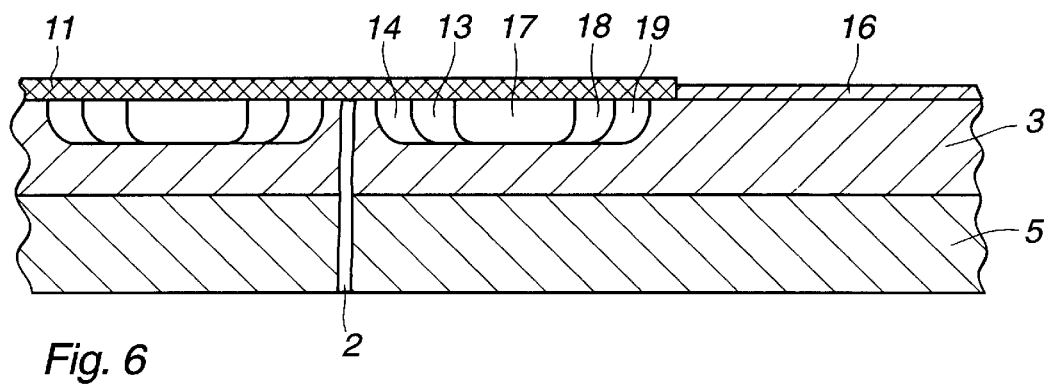
FIG. 6 shows a cross section of a Schottky diode exhibiting a micropipe where the micropipe has been excluded from the high-field region of the device.

A Schottky diode as shown in FIG. 6 may be manufactured on a substrate that exhibits micropipes 2 according to a fifth embodiment of the present invention. The device is manufactured in a way similar to the above embodiments regarding the low n-doped layer 3 which has been epitaxially grown on top of an n-doped layer of SiC 5. Using the positions stored in the memory a mask is applied on the first layer leaving ring formed areas surrounding the micropipes unmasked. A first zone of a transition region as well as a first zone of the termination 17 is formed by ion implanting the area being unmasked with a p-type dopant. By unmasking a zone surrounding the micropipe as well as the second zone 18 of the transition region followed by ion implantation, a second zone 13 of the termination as well as a second zone of the transition region are formed. Further zones 14, 19 are formed in a similar way. A metal layer 16 is formed in contact with the first layer 3. The transition region constitutes an increasing sheet charge density in a direction from the metal layer towards the micropipe and has the function of decreasing the maximum electric field at the metal layer edge. The termination region constitutes a decreasing sheet charge density in a direction towards the micropipe. A passivating layer 11 is applied over the micropipe as well as the termination region.

According to a sixth embodiment of the present invention the pn junction is produced in accordance with any one of the preceding embodiments. The JTEs surrounding the micropipes are formed as semi-insulating layers on top of the second layer adjacent to the third layer. The semi-insulating layer may be poly-crystalline silicon. The function of the semi-insulating layer is to leak a small current in a direction along the surface to thereby spread the electric field.

Figure 7:
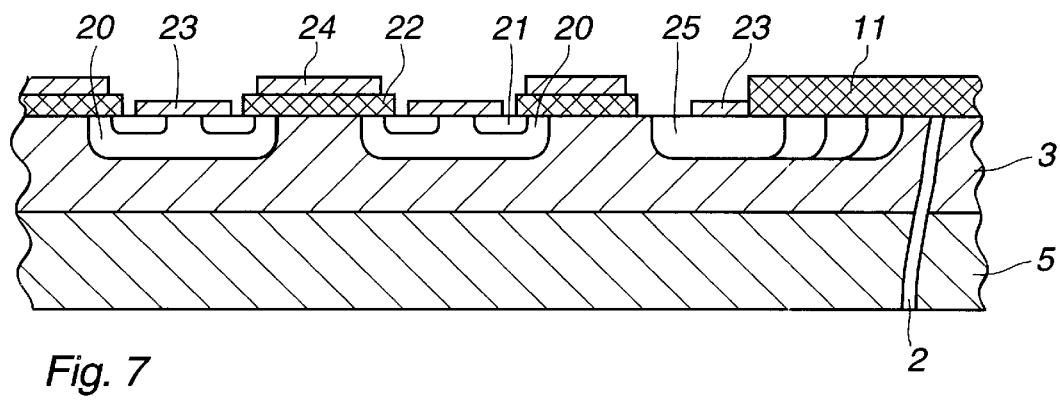
FIG. 7 shows a cross section of a device comprising a MOSFET which also exhibits a micropipe that has been excluded from the high-field region of the device by means of a termination region surrounding the micropipe.

The scope of the invention is not limited to diodes. According to the present invention the pn junction can be a part of a switching device such as for example an IGBT, a MISFET, a JFFT, a FCT or a bipolar transistor. FIG. 7 shows a cross section of a device comprising a number of MISFETs. The device in FIG. 7 may be produced by starting with a substrate, consisting of n-doped SiC, layer 5. On top of this layer a lowly n-doped layer 3 is epitaxially grown. P-base regions 20 are ion implanted into the second layer whereafter the highly doped n-source regions 21 are implanted. Gate insulating layers 22 are applied on top of the channel regions of the p-base. The source contact metal layers 23 are in contact also with the base layer. The gate contact metal layers 24 are applied on top of the gate insulating layers. The p-base regions are in contact with each other and are also in contact with the edge p-region 25. The micropipe 2 is excluded from the high-field region of the device by the edge termination at the edge p-region. The edge termination region is manufactured by implanting zones with a stepwise decreasing doping density in a direction towards the micropipe as in the second embodiment above. Thus, a termination region is achieved having a stepwise decreasing effective sheet charge density in a direction towards the micropipe. A passivating layer 11 is applied over the micropipe as well as the termination region.

Figure 8:
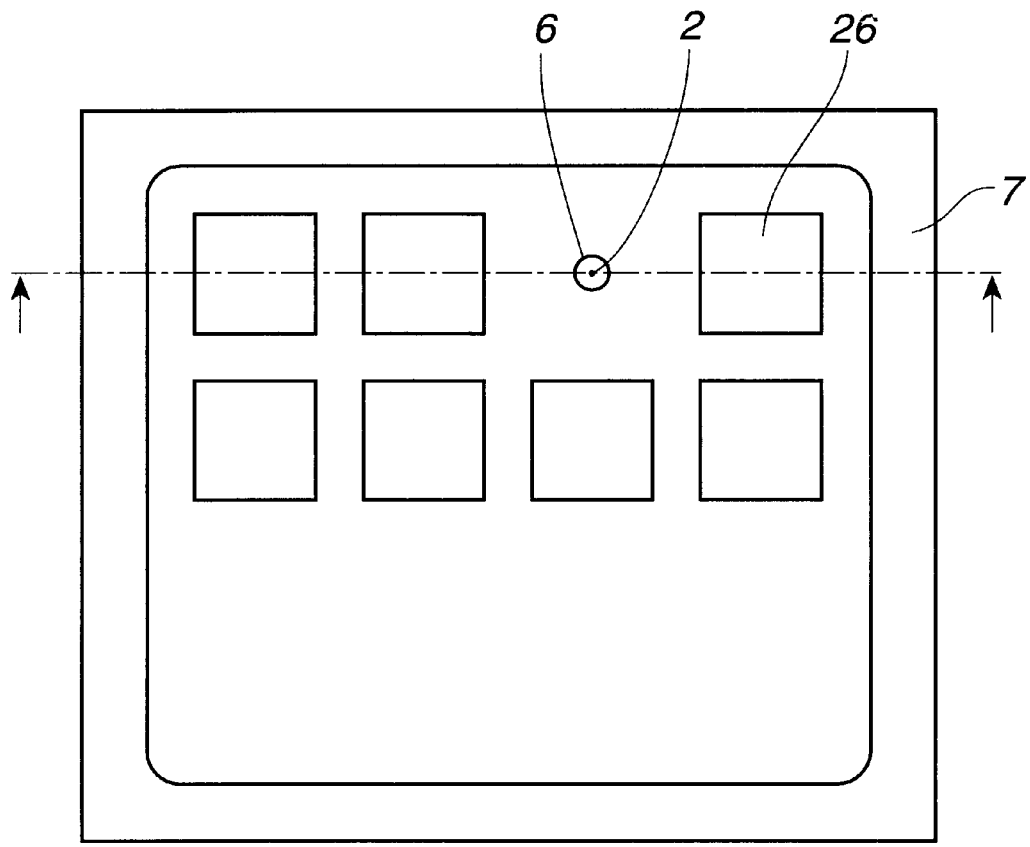
FIG. 8 shows a schematic view of a device comprising MOSFETs which also exhibits a micropipe that has been excluded from the high-field region of the device by means of a termination region surrounding the micropipe.
Figure 9:
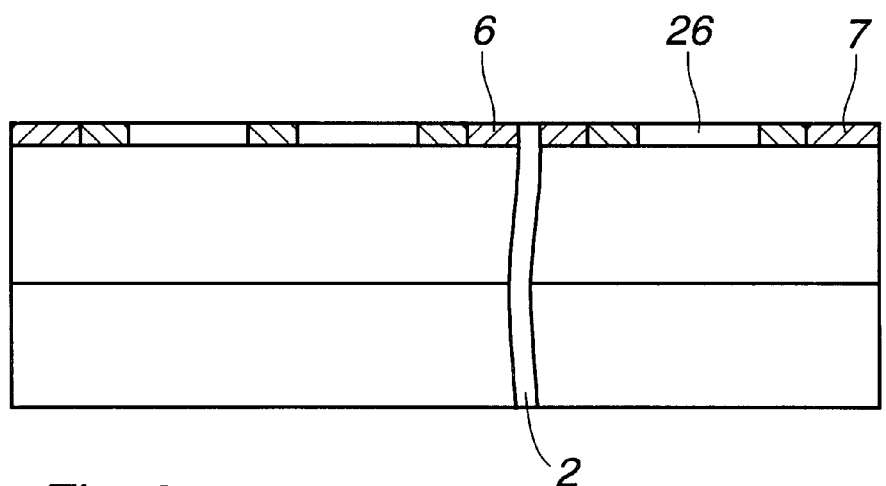
FIG. 9 shows a schematic cross section of the device in FIG. 8.

FIGS. 8 and 9 show an SiC device with a number of active device areas 26. The device areas may comprise a number of switching devices as shown in FIG. 7. FIG. 8 shows a top view of the device while FIG. 9 shows a cross section. A micropipe 2 is excluded from the high-field region of the device as a termination region 6 is applied around the micropipe. The device of the figures also has an edge termination region 7 at the edge of the device.

A switching device may of course have a termination region according to any one of the embodiments above. A man skilled in the art may use any one of the known termination types in a device according to the invention.

The sheet charge density is defined as the integral of the doping density over the thickness of the layer.

The term SiC is used in the following text to refer to any of the principal crystal polytypes of this material known as 6H, 4H, 2H, 3C and 15R.

What is claimed is:

1. A method of fabricating a semiconductor device on a substrate, the substrate comprising a first layer of doped silicon carbide (SiC) of a first conducting type and, having at least one hollow defect said method comprising the steps of:

identifying the positions of the hollow defects in the substrate;

forming a second SiC layer of a second conducting type in contact with the first layer; and providing the first and second layer constituting the pn junction with at least one edge termination surrounding any hollow defect, whereby the defect is excluded from the high-field region of the device.

2. A method of fabricating a semiconductor device on a substrate, the substrate comprising a first layer of doped silicon carbide (SiC) of a first conducting type and exhibits at least one hollow defect, said method comprising the steps of:

identifying the positions of the hollow defects in the substrate;

forming a metal layer on the first layer excluding areas around the micropipes, in that a Schottky diode is formed;

providing the Schottky junction with at least one edge termination surrounding any hollow defect, whereby the defect is excluded from the high-field region of the device.

3. A method according to claim 1, wherein for forming the pn junction, the first layer, being low doped, is epitaxially grown on a third layer of the first conducting type, the first and third layer forming the substrate, and the second layer, being highly doped, is formed by implanting a dopant into a portion of the first layer, and wherein the areas surrounding the hollow defects are excluded from ion implantation.

4. A method according to claim 1, wherein for forming the pn junction, the first layer, being low doped, is epitaxially grown on a third layer of the first conducting type, the first and third layer forming the substrate, and the second layer, being highly doped, is epitaxially grown on top of the first layer.

5. A method according to claim 3, wherein for forming an edge termination, a mask is applied to an area surrounding a defect, the mask comprising openings that exhibit a decreasing size in a direction towards the defect, a dopant is added by ion implantation through the mask wherein an edge termination is created having a decreasing concentration of dopants of the second conducting type in a direction towards the micropipe.

6. A method according to claim 3, wherein for forming an edge termination, a mask is applied to an area surrounding a defect, the mask comprising openings, where the distance between the openings is increasing in a direction towards the defect, a dopant is added into the first layer by ion implantation through the mask, wherein an edge termination is created having a decreasing concentration of dopants of the second conducting type in a direction towards the micropipe.

7. A method according to claim 3, wherein for forming an edge termination, a zone, having a doping of the second conducting type, is formed by ion implantation into an area surrounding a hollow defect and is surrounded by the second layer.

8. A method according to claim 3, wherein for forming an edge termination, concentric discrete zones, having a doping of the second conducting type, surrounding the hollow defect, having stepwise decreasing doping concentration towards the hollow defect and being surrounded by the third layer, are formed by masking and ion implantation.

9. A method according to claim 5, wherein the implant used to form termination zones of p-conducting type is aluminum, boron or gallium, while the implant used to form JTE zones of n-conducting type is nitrogen.

10. A method according to claim 1, wherein for forming a pn junction with an edge termination, at least two layers of the second conducting type are epitaxially grown on top of the lowly doped first layer of the first conducting type, the doping concentration of each new second conducting type layer is successively increased, and the layers of the second conducting type are, through masking and etching, formed to have successively stepwise reduced areas.

11. A method according to claim 4, wherein for forming an edge termination, the second layer is, through masking and etching, formed to have a stepwise reduced thickness in a direction towards the hollow defect.

12. A method according to claim 3, wherein for forming an edge termination, a layer of semi insulating polycrystalline silicon is epitaxially grown adjacent to the second layer and surrounding the hollow defect.

13. A method according to claim 3, wherein the pn-junction is a part of any of a MISFET, an IGBT, a JFET or a FCT.

* * * * *